(12) United States Patent
Yan

(10) Patent No.: US 9,972,374 B1
(45) Date of Patent: May 15, 2018

(54) FERROELECTRIC RANDOM ACCESS MEMORY (FERAM) ARRAY WITH SEGMENTED PLATE LINES THAT ARE ELECTRICALLY-ISOLATED FROM EACH OTHER

(71) Applicant: AUCMOS Technologies USA, Inc., Santa Clara, CA (US)

(72) Inventor: Tianhong Yan, Saratoga, CA (US)

(73) Assignee: AUCMOS TECHNOLOGIES USA, INC., Santa Clara, CA (US)

(*) Notice: Subject to any disclaimer, the term of this patent is extended or adjusted under 35 U.S.C. 154(b) by 0 days. days.

(21) Appl. No.: 15/391,991

(22) Filed: Dec. 28, 2016

Related U.S. Application Data

(60) Provisional application No. 62/414,765, filed on Oct. 30, 2016.

(51) Int. Cl.
*G11C 11/22* (2006.01)

(52) U.S. Cl.
CPC ...... *G11C 11/2273* (2013.01); *G11C 11/2255* (2013.01); *G11C 11/2257* (2013.01); *G11C 11/2275* (2013.01)

(58) Field of Classification Search
CPC ....... G11C 5/063; G11C 11/22; G11C 7/1018; G11C 7/08; G11C 7/00; G11C 11/2273; G11C 11/2275; G11C 11/2255; G11C 11/2257

USPC ............ 365/145, 230.03, 189.15, 189.05, 63
See application file for complete search history.

(56) References Cited

U.S. PATENT DOCUMENTS

| | | | |
|---|---|---|---|
| 7,463,505 B2* | 12/2008 | Koide | G11C 5/063 257/E21.664 |
| 7,800,931 B2* | 9/2010 | Min | G11C 7/1018 365/145 |
| 7,995,370 B2* | 8/2011 | Koide | G11C 5/063 365/145 |
| 2003/0218898 A1* | 11/2003 | Rickes | G11C 11/22 365/145 |

* cited by examiner

*Primary Examiner* — Gene Auduong
(74) *Attorney, Agent, or Firm* — VLP Law Group, LLP; Edward C. Kwok, Esq.

(57) ABSTRACT

A ferroelectric random access memory (FeRAM) array includes (a) a first section of FeRAM cells sharing a first plate line and a word line; and (b) a second section of FeRAM cells sharing a second plate line and the word line, wherein the first plate line and the second plate line are electrically unconnected, and wherein only the first section of FeRAM cells or the second section of FeRAM cells, but not both, are selected for a read operation at any given time. In each section of the FeRAM cells, a plate line selection cell connects the corresponding plate line to a plate line selection line. Each FeRAM cell in each section is read or written over a pair of bit lines running in a direction transverse to the word line of the section, and the plate line selection line runs along a direction parallel to the bit lines.

4 Claims, 6 Drawing Sheets

US 9,972,374 B1

FERROELECTRIC RANDOM ACCESS MEMORY (FERAM) ARRAY WITH SEGMENTED PLATE LINES THAT ARE ELECTRICALLY-ISOLATED FROM EACH OTHER

CROSS REFERENCE TO RELATED APPLICATIONS

The present application relates to and claims priority of U.S. provisional patent application ("Provisional Application"), Ser. No. 62/414,765, entitled "Segment Plateline of Ferroelectric Memory Array," filed on Oct. 28, 2016. The disclosure of the Provisional Application is hereby incorporated by reference in its entirety.

BACKGROUND OF THE INVENTION

1. Field of the Invention

The present invention relates to memory circuits. In particular, the present invention relates to an efficient organization of a ferroelectric random access memory (FeRAM) array.

2. Discussion of the Related Art

A ferroelectric random access memory (FeRAM) cell stores data in a capacitor using the memory property of a ferroelectric material. FIG. 1(a) is a schematic diagram showing FeRAM circuit 100. As shown in FIG. 1(a), FeRAM circuit 100 includes an array of FeRAM cells. For illustration purpose, FeRAM array 100 of FIG. 1(a) is represented by FeRAM cells 101a and 101b. FeRAM cells 101a and 101b together store one data bit, being represented in the two FeRAM cells in complementary representations. FeRAM circuit 100 also includes a sense amplifier, which receive data signals from FeRAM cells 101a and 101b representing the stored data bit over complementary bit lines 110a and 110b. An address decoder circuit (not shown) enables the data signals from FeRAM cells 101a and 101b to be placed on bit lines 110a and 110b after transistors 104 and 105 are rendered conductive momentarily to equalize and to discharge bit lines 110a and 110b. Thereafter, transistors 108 and 109 connects the sense amplifier to power supply voltage $V_{CC}$ and ground, thereby activating the cross-coupled inverters formed by transistors 106a, 106b, 107a and 107b to detect and to develop the data signals on bit lines 110a and 110b. After the detected signals are stable, the result (i.e., the detected data bit in FeRAM cells 101a and 101b) is latched into a data buffer.

FeRAM cells 101a and 101b each include a ferroelectric capacitor (e.g., ferroelectric capacitor 102a) and a select transistor (e.g., select transistor 103a) selectable by word line selection signal WL by the address decoder. FIG. 1(c) shows ferroelectric capacitor 102a and select transistor 103a of FeRAM cell 101a of FIG. 1(a). As shown in FIG. 1(c), when select transistor 103a rendered conducting, ferroelectric capacitor 102a is connected between plate line signal PL and bit line signal BL. When a programming voltage $V_{PP}$ is imposed across plate line signal PL and bit line signal BL, the ferroelectric capacitor is placed in a first programmed state ("0") and when a programming voltage $-V_{PP}$ is imposed across plate line signal PL and bit line signal BL, the ferroelectric capacitor is placed in a second programmed state ("1"). These states may be persistent for a period of time (e.g., from a few seconds to tens of years). The length of time during which the programmed state persist depends on the magnitude of the programming voltage.

FIG. 1(b) shows voltage signal PL, word line selection signal WL and bit line signal BL of FeRAM cell 101a during a read operation on FeRAM cell 101a of FIG. 1(a). As shown in FIG. 1(b), at time $t_0$, voltage signal PL on the plate line is raised to supply voltage $V_{CC}$ and word line selection signal WL is raised to $V_{PP}$, which is at least as high as supply voltage $V_{CC}$ plus a threshold voltage of the select transistor 103a, so that selection transistor 103a becomes conducting. If the programmed state in ferroelectric capacitor 102a is "1", bit line signal BL rises above reference signal $V_{ref}$, while driving the programmed state in ferroelectric capacitor to non-volatile state "0". However, if the programmed state in ferroelectric capacitor 102a is "0", the programmed state in ferroelectric capacitor 102a would stay at "0" and bit line signal BL does not rise above reference signal $V_{ref}$. Shortly after time $t_1$, bit line signal BL converges to $V_{CC}$ or 0 volts, driven by the cross-coupled inverters of transistors 106a, 106b, 107a and 107b of the sense amplifier, according to the programmed state of ferroelectric capacitor 102a at the beginning of the read operation. Between times $t_1$ and $t_2$, the output of the sense amplifier is latched into a buffer. At time $t_2$, plate line signal PL is brought back to 0 volts (i.e., ground voltage), so that the programmed state of ferroelectric capacitor 102a may be restored back to programmed state "1" by the $-V_{CC}$ voltage between bit line signal BL and plate line signal PL across ferroelectric capacitor 102a. If the detected programmed state is "0", as the bit line signal BL is at ground voltage, the "0" state of ferroelectric capacitor 102b is reinforced between t2 and t3. At time $t_3$, the read operation is complete.

FeRAM circuit 100 of FIG. 1(a) is a simplified circuit provided to illustrate the read operations of a FeRAM cell. FIG. 1(d) shows FeRAM array 150, which is one implementation of an FeRAM array whose read operation with respect to a single data bit may be represented by FeRAM circuit 100. As shown in FIG. 1(d), FeRAM circuit 150 includes a 2-dimensional array of FeRAM cells with plate lines $PL_i$ and word line selection lines $WL_i$ running along one direction, and paired complementary bit lines $BLT_j$ and $BLC_j$ running in a transverse direction connecting any of the ferroelectric capacitors along the transverse direction to a corresponding one of the read/write sense amplifiers 151a to 151n. As shown in FIG. 1(d), each plate line signal $PL_i$ is shared by all FeRAM cells selected by the same word line selection signal $WL_i$. The read and write operations of all FeRAM cells selected by the same word line selection signal, which may be in the thousands of FeRAM cells, are carried out in parallel, even when not all such FeRAM cells are required to be read. As FeRAM cells programmed in the "1" state have to be restored following the read operation, the unnecessary data-restoring write operation reduces the endurance of FeRAM array 150 and increase unnecessary power consumption Furthermore, in FeRAM array 150, the sense amplifiers and the read/write circuits are constrained to be laid out within the paired bit line pitch. Such constraint imposes a significant size penalty.

SUMMARY

According to one embodiment of the present invention, a ferroelectric random access memory (FeRAM) array includes (a) a first section of FeRAM cells sharing a first plate line and a word line; and (b) a second section of FeRAM cells sharing a second plate line and the word line, wherein the first plate line and the second plate line are electrically unconnected, and wherein only the first section of FeRAM cells or the second section of FeRAM cells, but not both, are selected for a read operation at any given time. In each section of the FeRAM cells, a plate line selection cell connects the corresponding plate line to a plate line selection line. Each FeRAM cell in each section is read or written over a pair of bit lines running in a direction transverse to the word line of the section, and the plate line selection line runs along a direction parallel to the bit lines.

In one embodiment, the plate line selection cell differs structurally from a FeRAM cell by having a conductive material in the plate line selection cell in place of a ferroelectric material in the FeRAM cell.

When the first section of FeRAM cells are being read in a read operation, signals relating to the read operation are carried on the first plate line, while the second plate line is clamped to a ground reference voltage. In one embodiment, a set of sense amplifiers are selectably connected by a set of multiplexers to either the first section of FeRAM cells or the second section of FeRAM cells, but not both, for reading data stored in the connected section of FeRAM cells.

The present invention is better understood upon consideration of the detailed description below in conjunction with the accompanying drawings.

DETAILED DESCRIPTION OF THE PREFERRED EMBODIMENTS

The harm to endurance by unnecessary data-restoring writes is virtually eliminated by segmenting the plate lines, such that each plate line is shared by a relatively smaller number of FeRAM cells (e.g., 16 or 32), rather than thousands.

Figure 1A:
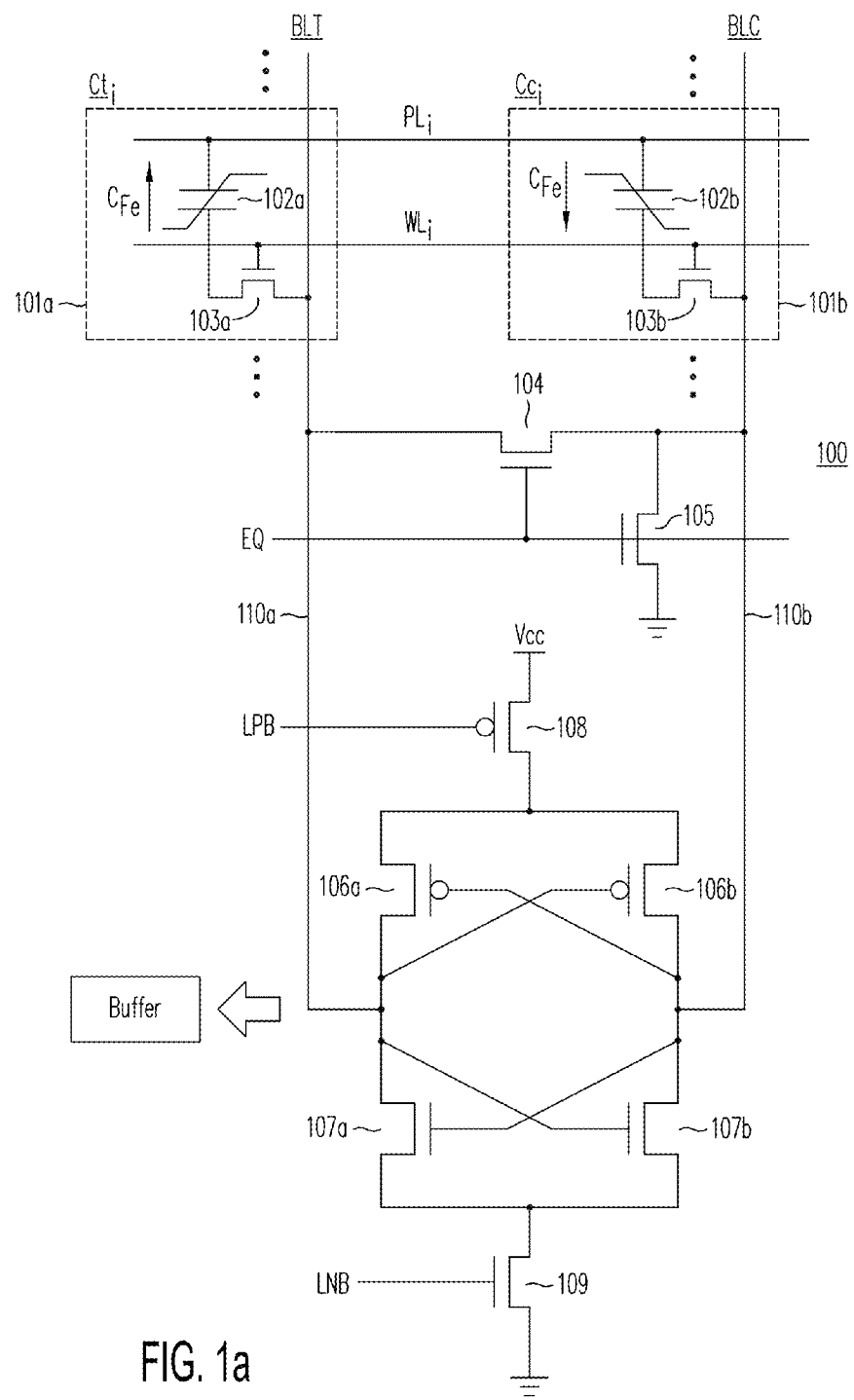
FIG. 1(a) is a schematic diagram showing FeRAM circuit 100.
Figure 1B:
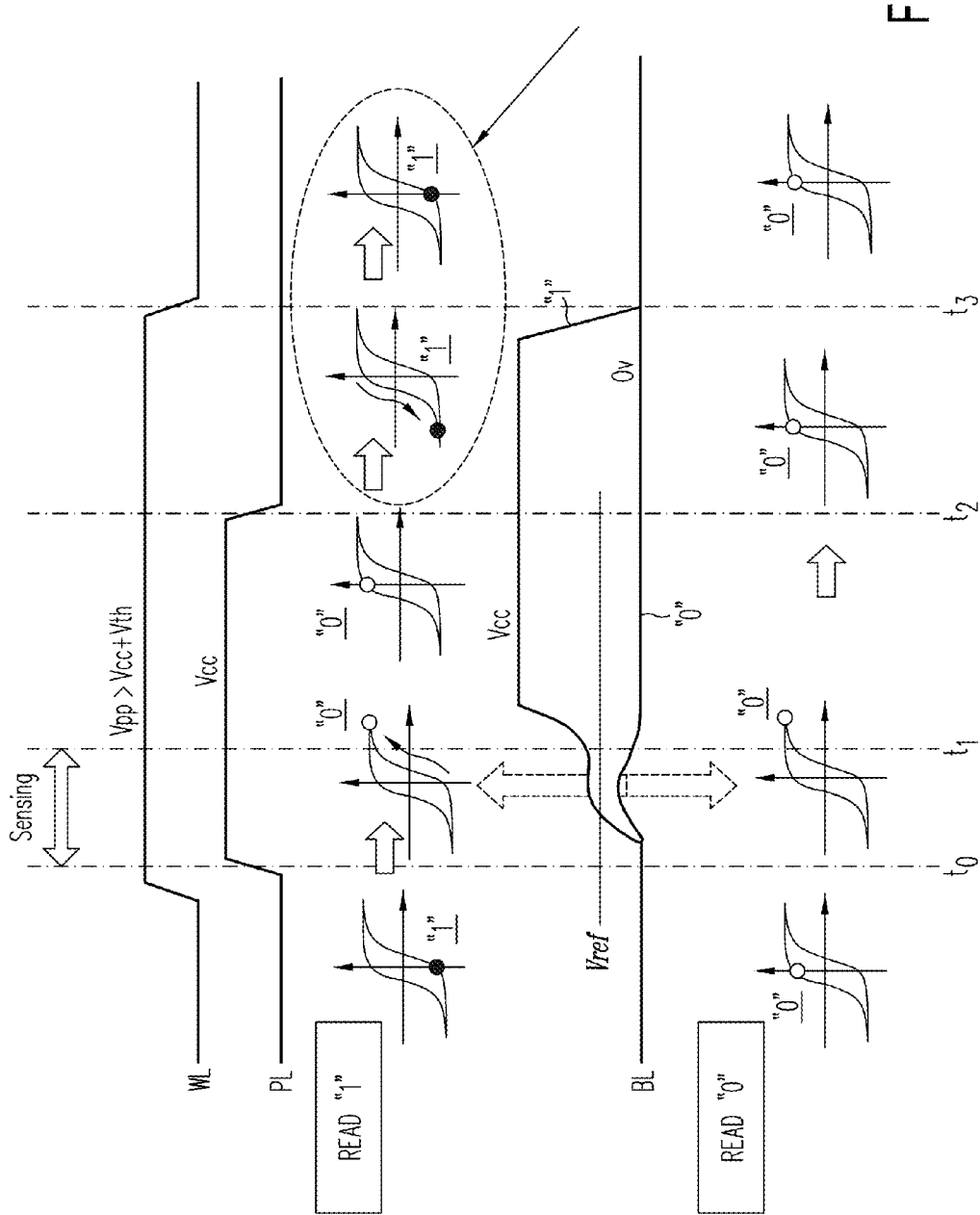
FIG. 1(b) shows voltage signals PL, word line selection signal WL and bit line signal BL of FeRAM cell 101a during a read operation on FeRAM cell 101a of FIG. 1(a).
Figure 1C:
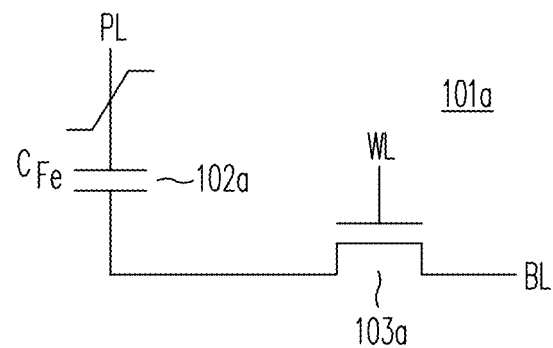
FIG. 1(c) shows ferroelectric capacitor 102a and select transistor 103a of FeRAM cell 101a of FIG. 1(a).
Figure 2B:
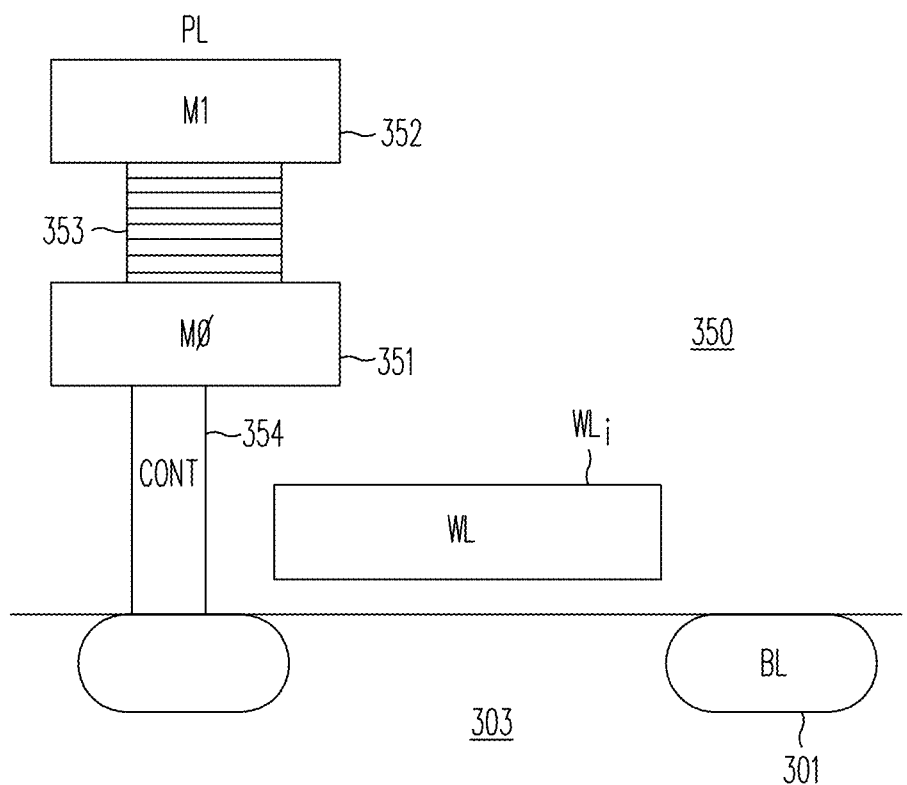
FIG. 2(b) shows a cross section through a plate line select cell (i.e., through plate line select transistor 303) of FeRAM array 300, in accordance with one embodiment of the present invention.
Figure 1D:
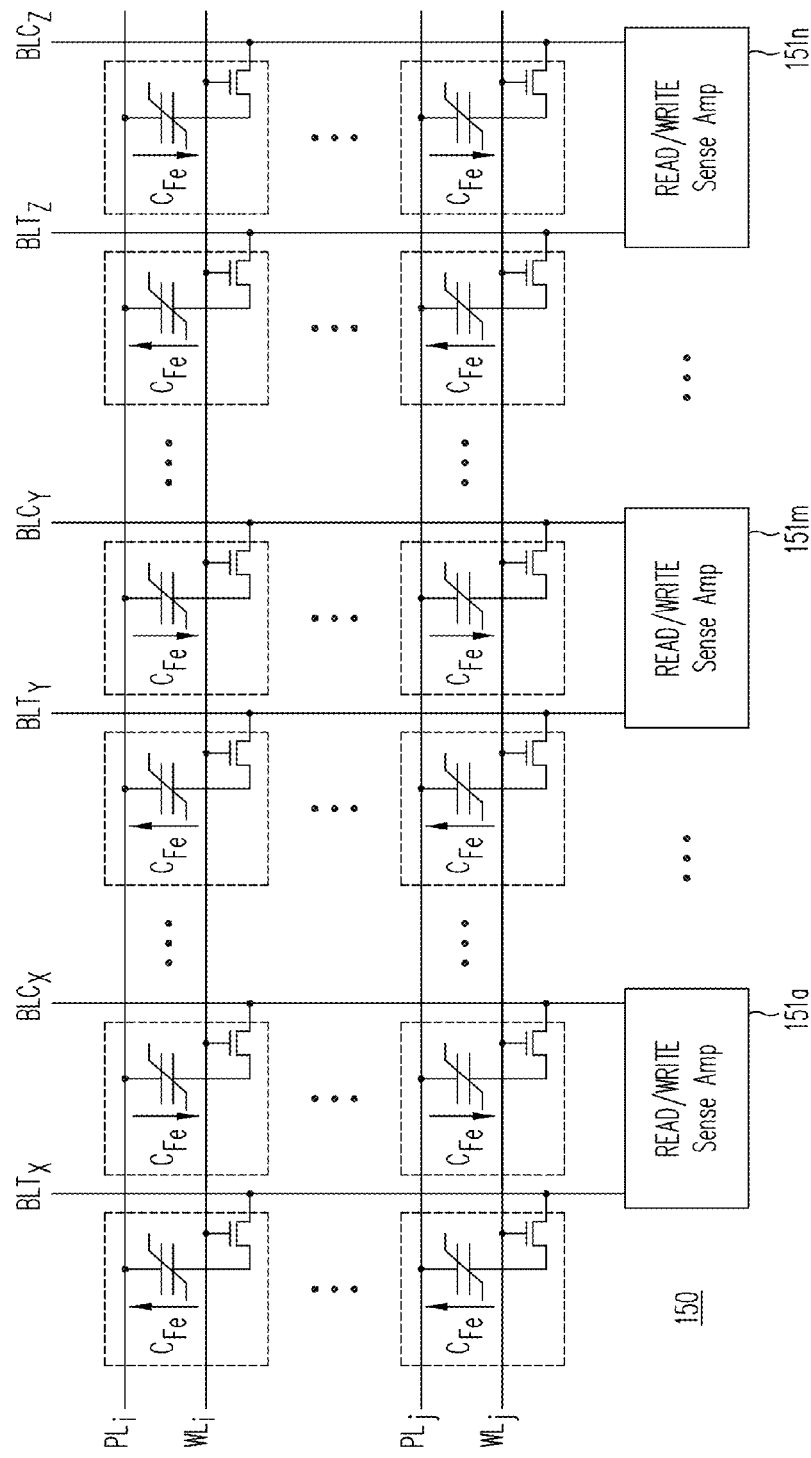
FIG. 1(d) shows FeRAM array 150, in which a large number of FeRAMs share the same bit line selection signal $WL_i$ and plate line signal $PL_i$.
Figure 2A:
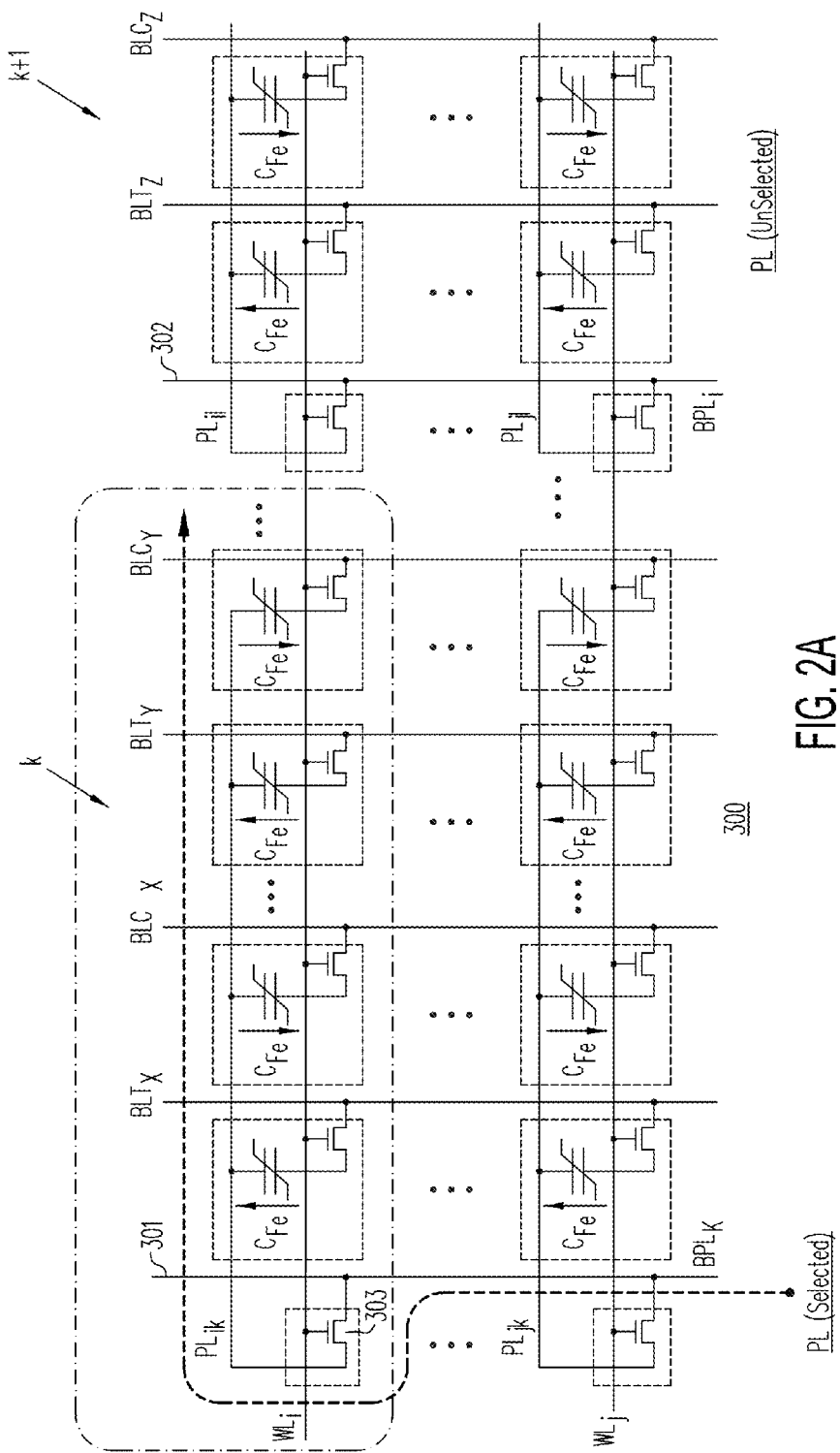
FIG. 2(a) shows FeRAM array 300 with segmented plate lines, in accordance with one embodiment of the present invention.

FIG. 2(a) shows FeRAM array 300 with segmented plate lines, in accordance with one embodiment of the present invention. As shown in FIG. 2(a), unlike FeRAM 150 of FIG. 1(d), different sections of FeRAM cells in FeRAM array 300 are selected by the same word line selection signal $WL_i$, but are provided different, shorter plate lines activated by plate line signals $PL_{ij}$. FIG. 2(a) shows section k of FeRAM array 300, which includes PL select line 301 running in a transverse direction to the segmented plate lines (i.e., PL select line 301 runs parallel to the bit lines). When section k is selected, plate line select transistor 303 connects section k's segmented plate line to PL select line 301, such that plate line signal $PL_{ik}$ for section k is routed onto the segmented plate line to enable a read operation to be conducted on the FeRAM cells of section k. At the same time, in a non-selected section, such as section (k+1) shown to the right of section k in FIG. 2(a), its plate line signal $PL_{i(k+1)}$ on PL select line 302 is clamped to a ground reference voltage which disables a read operation on the FeRAM cells of section (k+1). In this manner, only the FeRAM cells of selected section k are read, and only the programmed states of those FeRAM cells are required to be restored. Accordingly, the FeRAM cells in the non-selected FeRAM cells are not read without any plate-line switching and thus are not subject to the unnecessary harm to their endurance by the data-restoring write operations.

To implement FeRAM array 300 from the architecture of FeRAM array 150 of FIG. 1(d), one column of FeRAM cells every 16 or 32 columns are modified to provide a column of plate line select cells in the manner shown in FIG. 2(b). FIG. 2(b) shows a cross section of a plate line select cell (i.e., through plate line select transistor 303). As shown in FIG. 2(b), PL select transistor 303 includes a source or drain region that is connected to PL select line 301. The other source or drain region of PL select transistor 303 is connected by contact 354 to conductor 351 in a first interconnect metal level, which is separated but electrically connected to another conductor 352 at a second interconnect metal level by a conductive material 353 (commonly known as a via). This structure is otherwise the structure of a FeRAM cell, except that conductive material 353 occupies the space in which a ferroelectric material (e.g., PZT) would have been present if it were a FeRAM cell.

Figure 3:
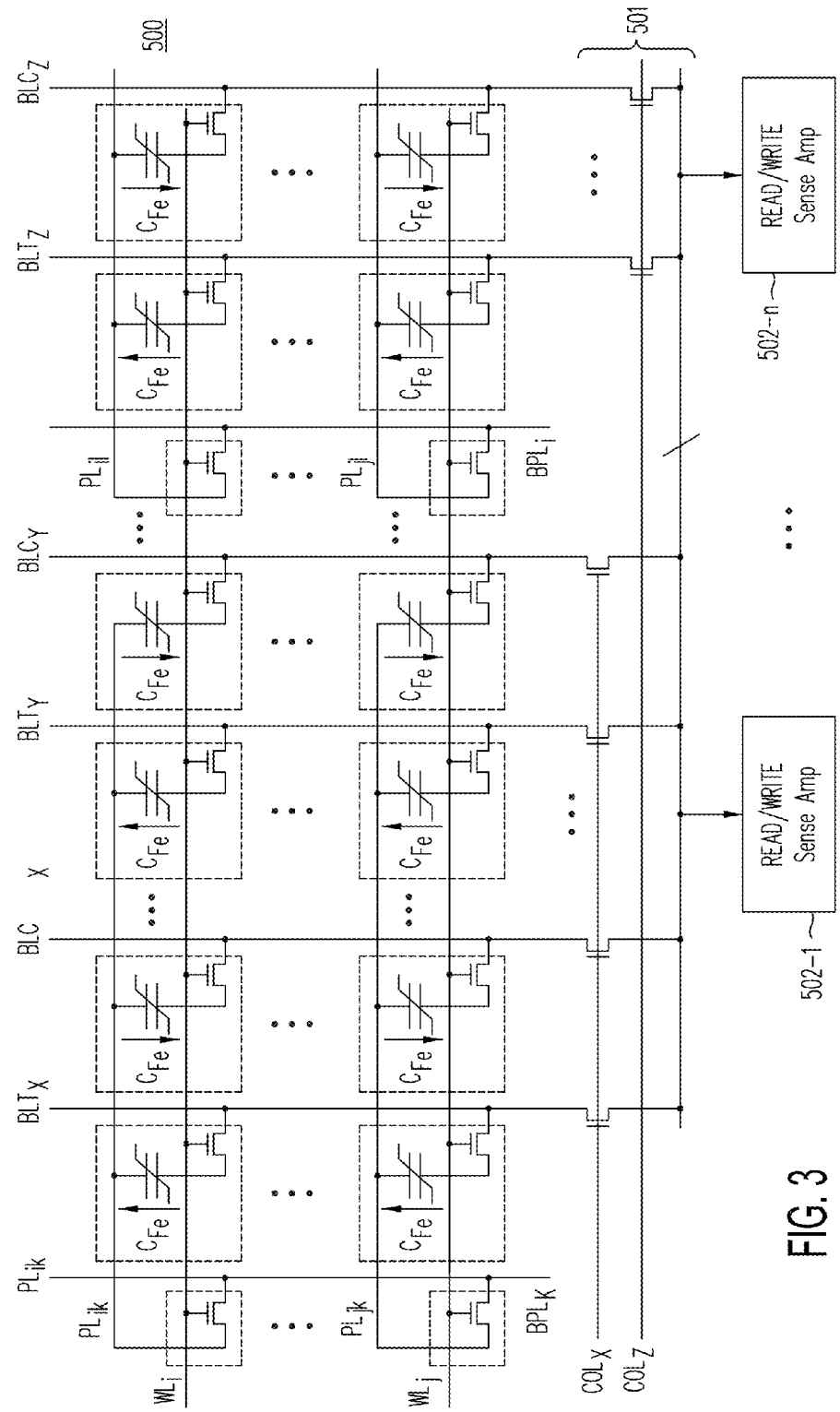
FIG. 3 shows FeRAM array 500 in which numerous sections of FeRAM cells corresponding different segmented plate lines share the same set of sense amplifier and read write circuits according to one embodiment of the present invention.

FIG. 3 shows FeRAM array 500 in which numerous sections of FeRAM cells corresponding to different segmented plate lines share the same set of sense amplifiers and read/write circuits according to one embodiment of the present invention. As shown in FIG. 3, a conventional multiplexer circuit routes the bit lines of a selected section of FeRAM cells in FeRAM array 500 to corresponding read/write circuits and sense amplifiers 502-1 to 502-n. As the plate lines in the non-selected sections are clamped to ground voltage, the bit lines in non-selected sections may be left floating without the danger of its corresponding FeRAM cells being subject to a destructive read operation. In this architecture, the sense amplifiers and the read/write circuits may be distributed on the integrated circuit and need not be constrained to within a bit line pair pitch. The number of sense amplifiers and read/write circuits may be significantly reduced from that required in the architecture of FeRAM 150 of FIG. 1(d). In fact, the minimum number of sense amplifiers required in this architecture is equal to the number of FeRAM cells in a section served by a segmented plate line (i.e., 16 or 32).

The above detailed description is provided to illustrate specific embodiments of the present invention and is not to be taken as limiting. Numerous variations and modifications within the scope of the present invention are possible. The present invention is set forth by the accompanying claims.

I claim:

1. A ferroelectric random access memory (FeRAM) array, comprising:
   a first section of FeRAM cells sharing a first plate line and a word line; and a second section of FeRAM cells sharing a second plate line and the word line, wherein the first plate line and the second plate line are electrically isolated from each other, wherein each section further comprises a plate line selection cell which connects the corresponding plate line to a plate line selection line, wherein each FeRAM cell in each section is read or written over a pair of bit lines running in a direction transverse to the word line of the section, and wherein the plate line selection line runs along a direction parallel to the bit lines.

2. The FeRAM array of claim 1, wherein the plate line selection cell differs structurally from a FeRAM cell by having a conductive material in the plate line selection cell in place of a ferroelectric material in the FeRAM cell.

3. The FeRAM array of claim 1, wherein when the first section of FeRAM cells are being read in a read operation, signals relating to the read operation are carried on the first plate line, while the second plate line is clamped to a ground reference voltage.

4. The FeRAM array of claim 1, further comprising a set of sense amplifiers, the set of sense amplifiers being selectably connected by a set of multiplexers to either the first section of FeRAM cells or the second section of FeRAM cells, but not both, for reading data stored in the connected section of FeRAM cells.

\* \* \* \* \*